(12) United States Patent
Chu et al.

(10) Patent No.: US 8,507,316 B2
(45) Date of Patent: Aug. 13, 2013

(54) PROTECTING T-CONTACTS OF CHIP SCALE PACKAGES FROM MOISTURE

(75) Inventors: Hui-Chen Chu, Hsin-Chu (TW); Yian-Liang Kuo, Toufen Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 267 days.

(21) Appl. No.: 12/976,437

(22) Filed: Dec. 22, 2010

(65) Prior Publication Data
US 2012/0161308 A1   Jun. 28, 2012

(51) Int. Cl.
*H01L 21/44*     (2006.01)
*H01L 21/30*     (2006.01)
*H01L 23/48*     (2006.01)

(52) U.S. Cl.
USPC ........... 438/107; 438/110; 438/455; 438/458; 438/618; 257/690; 257/692; 257/698; 257/700

(58) Field of Classification Search
USPC ........ 257/690, 692, 698, 700, 723, E23.001, 257/E23.019, E23.021; 438/107, 110, 455, 438/458, 612, 618
See application file for complete search history.

(56) References Cited

U.S. PATENT DOCUMENTS

| 7,566,944 B2 * | 7/2009 | Wang et al. ................... 257/459 |
| 2008/0099907 A1 * | 5/2008 | Oganesian et al. ........... 257/693 |
| 2010/0072635 A1 | 3/2010 | Kuo et al. |

* cited by examiner

*Primary Examiner* — Hsien Ming Lee
(74) *Attorney, Agent, or Firm* — Slater & Matsil, L.L.P.

(57) ABSTRACT

A method includes performing a first die-saw on a package structure includes forming a first and a second metal lead extending into a trench of a package structure, wherein the first and the second metal leads contact the side edges of contact pads that are in devices in the package structure. The first and the second metal leads are interconnected through a connecting metal portion. A pre-cut is performed to cut the connecting metal portion to separate the first and the second metal leads, wherein remaining portions of the connecting metal portion have edges after the pre-cut. A dielectric coating is formed over the first and the second metal leads. A die-saw is performed to saw apart the package structure, so that the first and the second dies are separated into separate piece. In each of the resulting pieces, the edges of the remaining portions of the connecting metal portion are covered by remaining portions of the first dielectric coating.

20 Claims, 11 Drawing Sheets

PROTECTING T-CONTACTS OF CHIP SCALE PACKAGES FROM MOISTURE

BACKGROUND

Chip Scale Packaging (CSP) is used to form packages that have substantially the same sizes as semiconductor dies. One of the applications of the CSP is the packaging of complementary metal-oxide-semiconductor (CMOS) image sensor dies. The image sensors, which may be formed of CMOS devices, are formed at a front surface of a silicon substrate, which is a portion of an image sensor die. A backside grinding is performed to the silicon substrate until the thickness of the silicon substrate is thin enough to allow light to penetrate the silicon substrate from the backside to reach the image sensors.

In the packaging of the image sensor dies, a glass is bonded to the backside of the image sensor die in order to protect the image sensor die, while at the same time allowing the light to reach the image sensors. The electrical connections to the image sensors are made through T-contacts, wherein aluminum pads over the silicon substrate and electrically coupled to the images sensors are connected to metal lines, which are formed on the sidewalls of the respective package structure.

The packaging of the image sensor dies is performed before the wafers comprising the image sensor dies are sawed. After the ball-grid array (BGA) balls are formed to connect to the T-contacts, the resulting package structure is sawed to separate the image sensor dies. However, since the packaging requires the sawing of aluminum pads, the edges of the aluminum pads are exposed to open air, and are subject to the attack of moisture. This may cause the peeling of the respective aluminum pads. In addition, since the silicon substrate in the image sensor die may be ground to a very small thickness, for example, about 2 μm, the expansion of the aluminum pads caused by the aluminum corrosion will also cause the crack of the silicon substrates, and hence the failure of the resulting package structure.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel package structure comprising T-contacts and the method for forming the same are provided in accordance with an embodiment. The intermediate stages of manufacturing an embodiment are illustrated. The variations and the operation of the embodiment are then discussed. Throughout the various views and illustrative embodiments, like reference numbers are used to designate like elements.

FIGS. 1 through 9 schematically illustrate intermediate stages in the formation of T-contacts on a package structure. The package structure comprises device wafer 20, carrier wafer 30, and glass wafer 25 bonded to device wafer 20. In FIGS. 1 through 9, device wafer 20 is illustrated schematically, and more details of the features in device wafer 20 are schematically illustrated in FIG. 10. Referring to FIG. 10, device wafer 20 includes substrate 24, and devices 28 formed at top surface 24A of substrate 24. Substrate 24 may be a silicon substrate, although it may also be formed of other semiconductor materials such as III-nitride semiconductors, GaAs, silicon carbon, or the like. In alternative embodiments, substrate 24 may be formed of dielectric materials such as organic materials, ceramics, or the like. Devices 28 may include complementary metal-oxide-semiconductor (CMOS) transistors, resistors, capacitors, inductors, and/or the like. In an embodiment, devices 28 include CMOS image sensors, which in response to the received light, may generate currents whose magnitudes are related to the light intensity. Accordingly, devices 28 are also sometimes referred to as image sensors 28 hereinafter. In the embodiments wherein devices 28 are image sensors, a backside grinding may be performed on silicon substrate 24, so that the thickness of silicon substrate 24 is reduced to, for example, less than about 4 μm, and hence light 120 may penetrate through silicon substrate 24 and reach devices 28.

Device wafer 20 includes dies 100, and scribe lines 104 between and separating dies 100. Contact pads 26 may be formed in dies 100 and electrically couple to the devices in dies 100. In an embodiment, as shown in FIG. 10, contact pads 26 are electrically coupled to devices 28. Contact pads 26 may extend into scribe lines 104. It is appreciated that although FIG. 10 only illustrates one metal layer over substrate 24, there may be a plurality of metal layers, and contact pads 26 may be in any of the plurality of metal layers. In an embodiment, contact pads 26 are in the second metal layer. Each of the plurality of metal layers is in one of dielectric layers. For example, the metal layer of contact pads 26 is in dielectric layer 29. Contact pads 26 may be formed of metals or metal alloys, which may comprise aluminum, tungsten, nickel, copper, and combinations thereof.

Device wafer 20 may be bonded to carrier wafer 30. In an embodiment, the bonding is through a diffusion bonding between oxide layer 31 (a top layer of device wafer 20) and the oxide material of carrier wafer 30. The bonding may be performed before the backside grinding of substrate 24. Accordingly, carrier wafer 30 may provide a mechanical support for the backside grinding of substrate 24 to prevent substrate 24 from breaking.

Device wafer 20 is also adhered to transparent wafer 25 through material 34 that may act as an adhesive. Transparent wafer 25 is transparent for the wavelengths of the light that image sensors 28 are designed to sense. In an embodiment, transparent wafer 25 is a glass wafer. Adhesive 34 forms dams that overlap scribe lines 104. In some embodiments, adhesive 34 comprises a solder mask, and hence dams 34 are also referred to as solder-mask dams 34 hereinafter, although dams 34 may also be formed of other materials. Solder-mask dams 34 may also extend to overlap edge portions of dies 100. However, in embodiments, solder-mask dams 34 do not overlap the center regions of dies 100. When viewed from a top view of the package structure, solder-mask dams 34 overlap all edge portions of each of dies 100, and the overlapped portions of solder-mask dams 34 form rings encircling the center regions of dies 100. Furthermore, solder-mask dams 34 may not overlap image sensors 28, so that light 120 is not blocked by solder-mask dams 34. Vacuum-gaps 36 may exist between transparent wafer 25 and device wafer 20. Accordingly, light 120 may pass transparent wafer 25 and vacuum-gaps 36, and then penetrates substrate 24 before it reaches devices 28.

Figure 1:
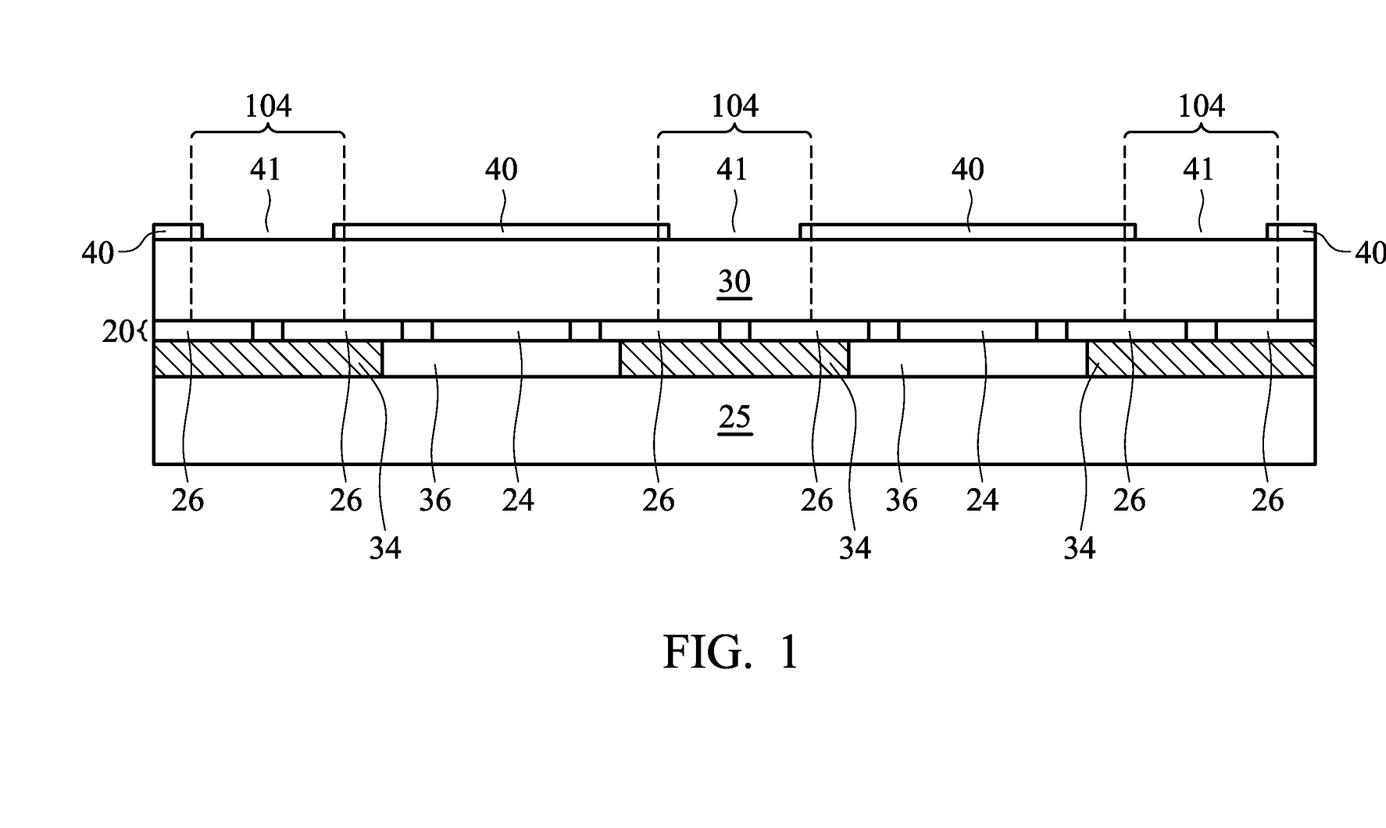
FIGS. 1 through 9 are cross-sectional views of intermediate stages in the manufacturing of a package structure including T-contacts.
Figure 2:
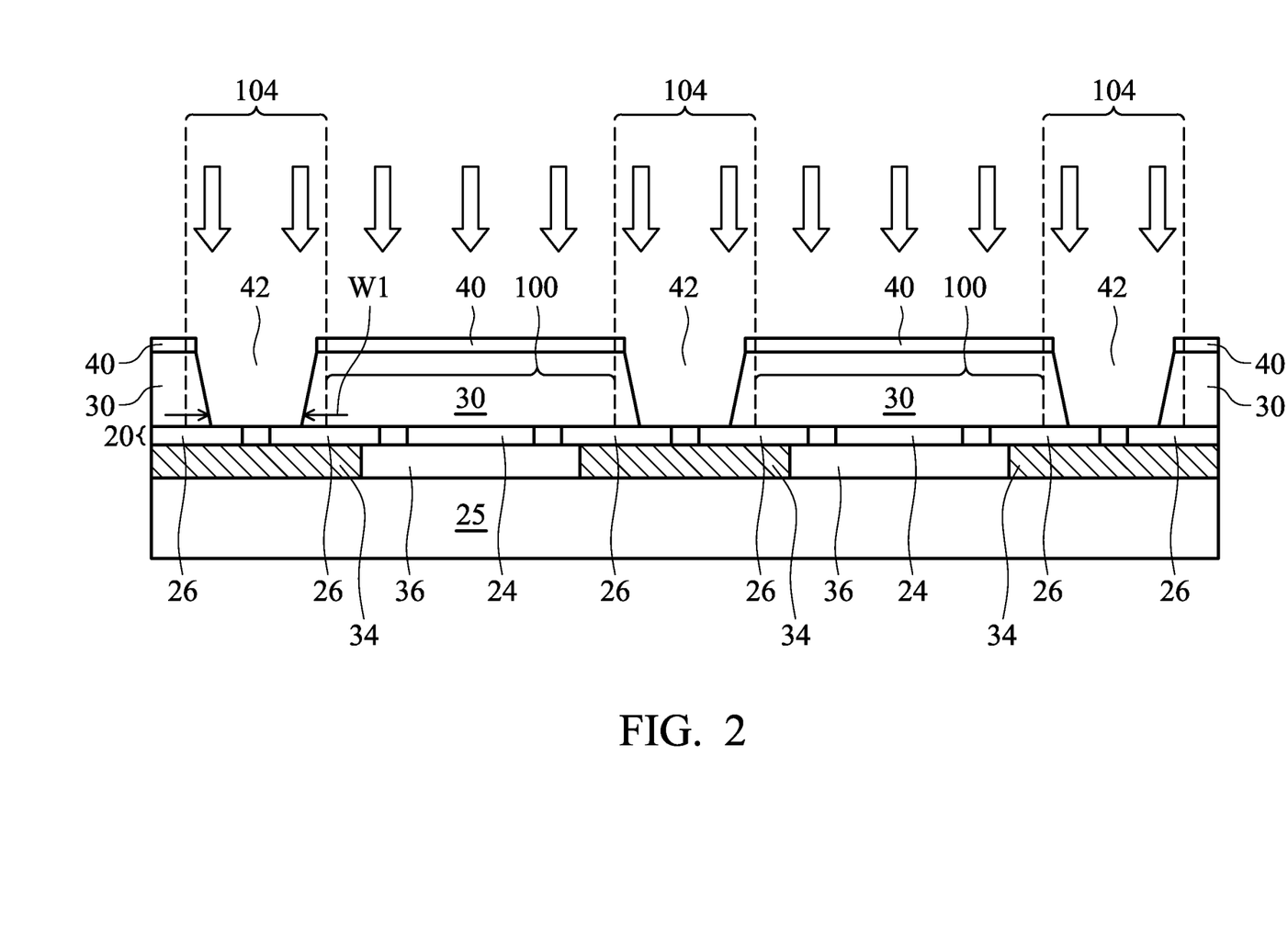

In the schematically illustrated FIGS. 1 through 9, substrate 24 and contact pads 26 are schematically illustrated, while other features in device wafer 20 are not shown. The relative positions of contact pads 26 and substrate 24, however, are merely illustrated symbolically. Referring back to FIG. 1, photo resist 40 is formed over carrier wafer 30, and is then patterned to form openings 41 directly over scribe lines 104 of device wafer 20. Furthermore, openings 41 at least partially overlap contact pads 26. Next, as shown in FIG. 2, an etching step is performed to etch the exposed portions of carrier wafer 30 through openings 41. Trenches 42 are thus formed. The etching step may be continued until the underlying contacts pads 26 are exposed. Alternatively, the etching may be stopped on a dielectric layer (not shown) over contact pads 26. The etching may be performed using dry etching, for example.

Figure 3:
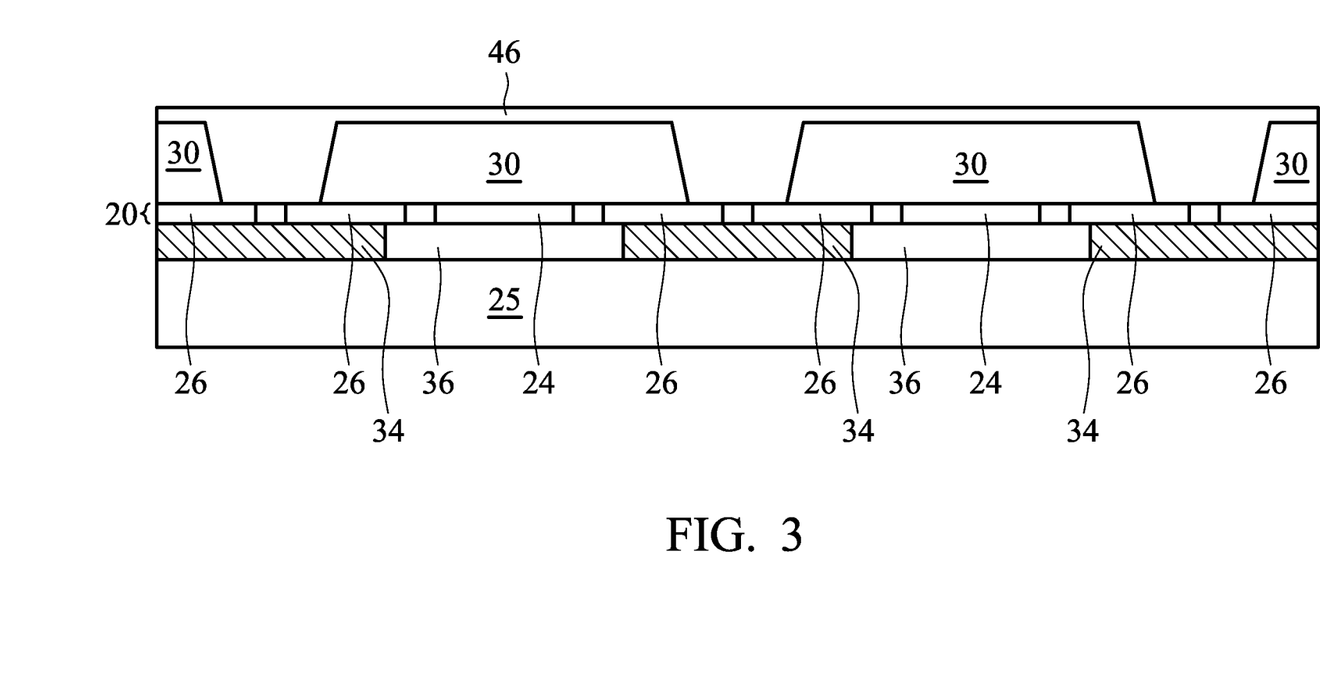

Next, as shown in FIG. 3, photo resist 40 is removed, and dielectric coating 46 is formed to cover carrier wafer 30 and extending into trenches 42 (FIG. 2). Dielectric coating 46 also covers the bottoms of trenches 42 and the sidewalls of carrier wafer 30 that are exposed to trenches 42. Accordingly, dielectric coating 46 may be in contact with the top surface of contact pads 26 in some embodiments. In an embodiment, dielectric coating 46 is formed of a solder mask, although it may also be formed of other dielectric materials such as epoxies.

Figure 4:
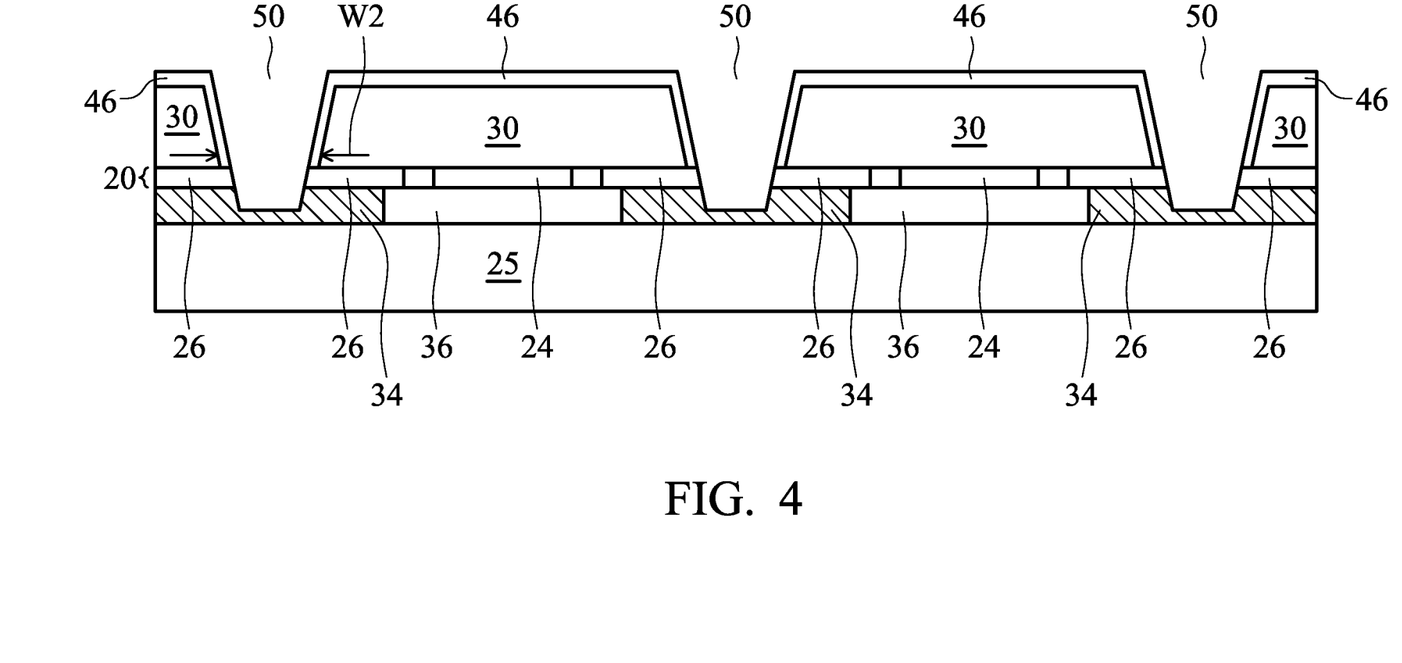

Referring to FIG. 4, a die-saw is performed. The resulting trenches 50 have bottoms lower than the bottom surfaces of contact pads 26, and contact pads 26 are also sawed. The remaining portions of contact pads 26 have side edges exposed to trenches 50. Trenches 50 may also extend slightly into solder-mask dams 34, so that dies 100 are separated from each other. The die-saw, however, may not extend into transparent wafer 25 in some embodiments. Since dies 100 are bonded to dams 34 and transparent wafer 25, the package structure as shown in FIG. 4 is not separated into individual pieces. In an embodiment, the width W2 of trenches 50 may be smaller than width W1 of trenches 42 as shown in FIG. 2, wherein widths W1 and W2 may be measured at the bottom surface of carrier wafer 30. As a result, there may be remaining portions of dielectric coating 46 on the sidewalls of carrier wafer 30.

Figure 5:
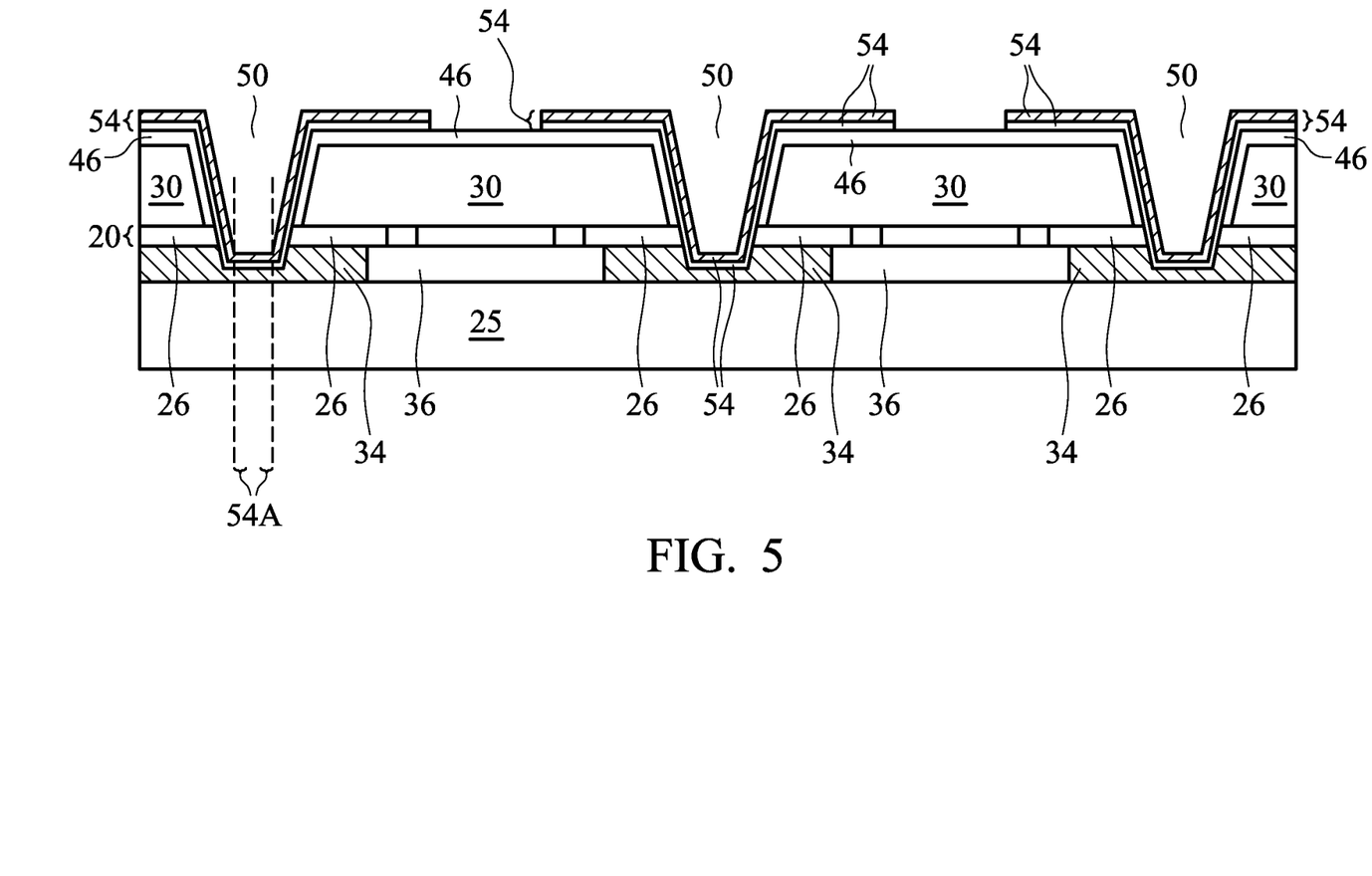

FIG. 5 illustrates the formation and the patterning of metal leads 54, which are formed over and possibly contacting dielectric coating 46. In the formation of metal leads 54, a metal layer, which may be a single metal layer or a composite layer comprising a plurality of metal layers formed of different materials, are first formed as a blanket layer. The formation methods include physical vapor deposition (PVD), although other methods may also be used. In an exemplary embodiment, the metal layer (and hence the resulting metal leads 54) is a composite layer formed of a titanium layer, a tungsten layer, an AlCu layer, a nickel layer, and/or a gold layer. In alternative embodiments, fewer layers selected from the Ti/W/AlCu/Ni/Au layers may be used to form the metal layer. After the blanket formation of the metal layer, a patterning is performed to etch the metal layer. Metal leads 54 are thus formed, wherein each of metal leads 54 is in contact with the side edge of one of contact pads 26. Hence, contact pads 26, which extend in the horizontal direction, form T-contacts with the respective connecting metal leads 54, which extend at least partially in the vertical direction. The name "T-contacts" are due to the T-shape at the contact points between metal leads 54 and contact pads 26. After the patterning, metal leads 54 on opposite sidewalls of trenches 50 are interconnected at the bottoms of trenches 50. Furthermore, the connecting portions 54A of metal leads 54 are lower than contact pads 26, and may extend into solder-mask dams 34.

Figure 6:
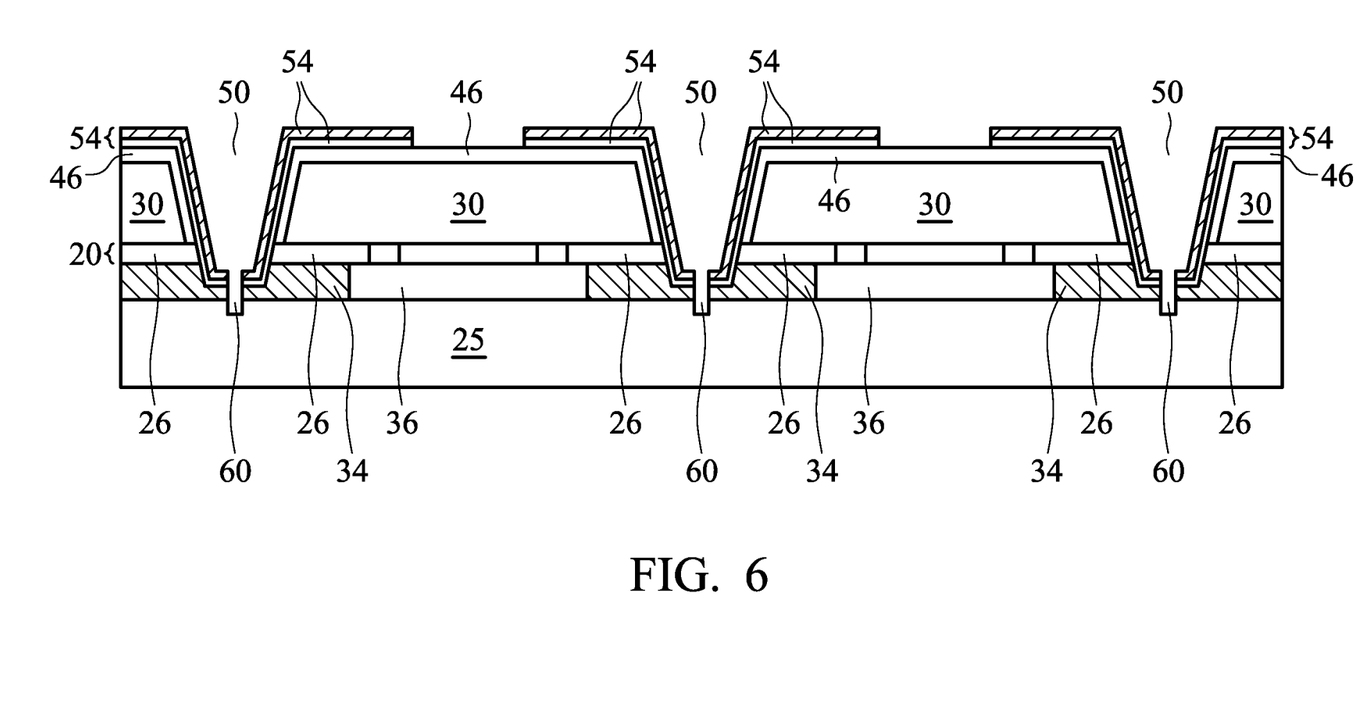

Next, as shown in FIG. 6, a pre-cut is performed on the connecting portions 54A of metal leads 54. Trenches 60 are thus formed as extensions of trenches 50. Trenches 60 may extend into solder-mask dams 34 and a top portion of transparent wafer 25 to ensure connecting portions 54A are cut through. The bottom portion of transparent wafer 25, however, it not cut by the pre-cut. In alternative embodiments, the bottoms of trenches 60 remain in solder-mask dams 34 and do not extend into transparent wafer 25. The pre-cut may be performed as a die-saw step.

Figure 7:
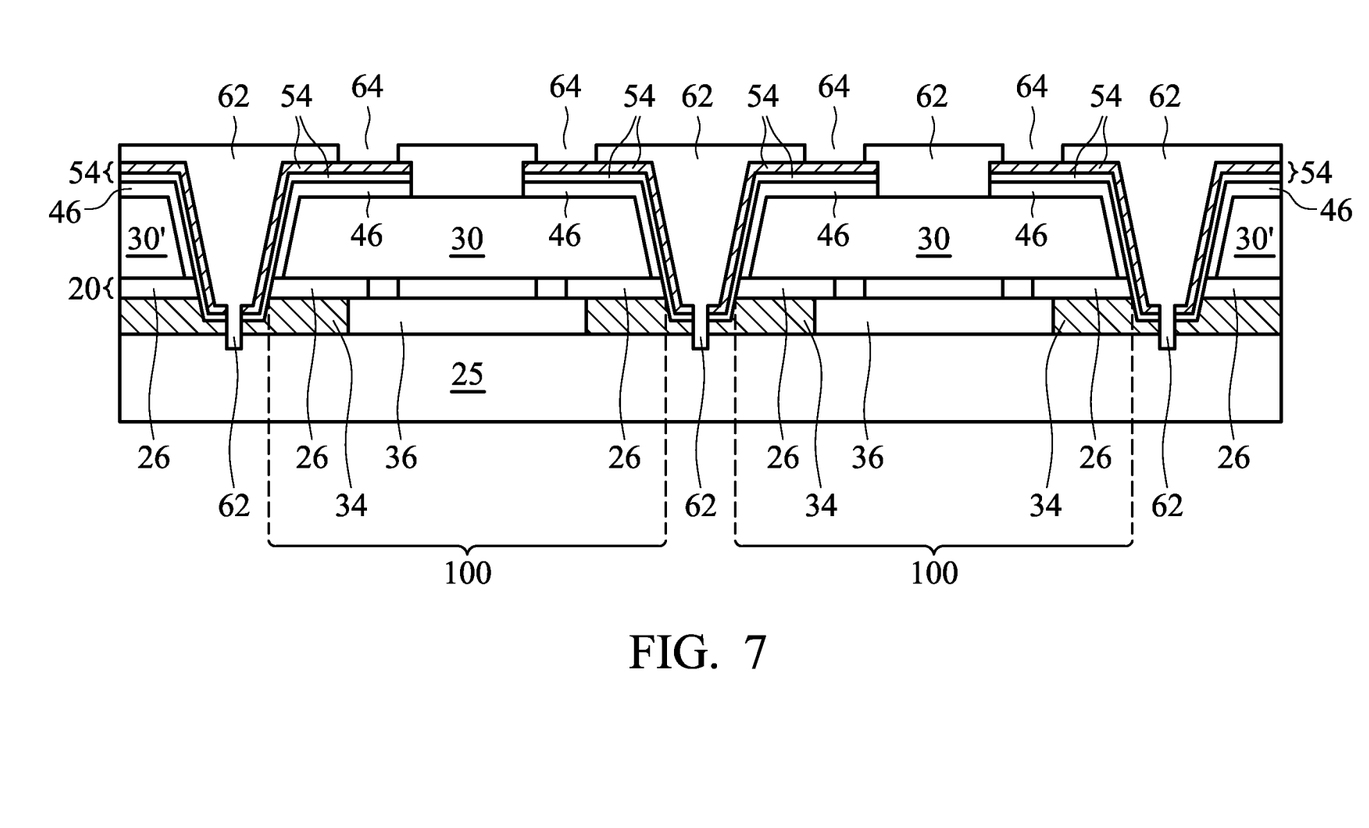

Referring to FIG. 7, dielectric coating 62, which may be a solder mask film, and hence is alternatively referred to as solder mask film 62 hereinafter, is formed to cover metal leads 54. Solder mask film 62 is thus over, and possibly contacting, metal leads 54. Solder mask film 62 may form an interface with solder-mask dams 34. Solder mask film 62 and solder-mask dams 34 may be formed of the same or different materials. It is appreciated that even if solder mask film 62 and solder-mask dams 34 are formed of a same solder mask material, since they are formed in different process steps, there is still noticeable interfaces. However, inside solder mask film 62, there may be no noticeable interfaces. Openings 64 are then formed in solder mask film 62 to expose metal leads 54. Openings 64 may be formed directly over the remaining portions of carrier wafer 30 and directly over dies 100.

Figure 8:
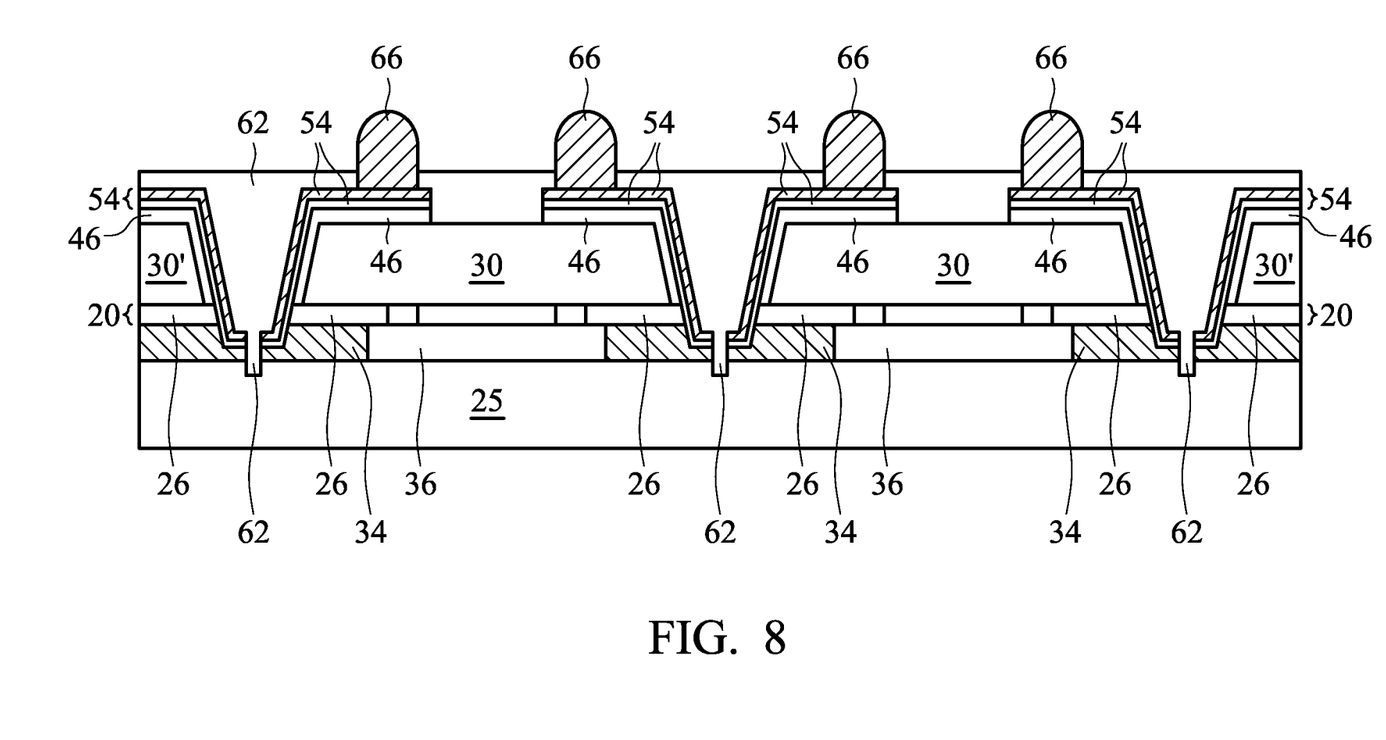

Metal bumps 66 are then formed in openings 64, as shown in FIG. 8. Accordingly, metal bumps 66 are electrically coupled to contact pads 26 through metal leads 54, and may be electrically coupled to devices 28 (not shown in FIG. 8, please refer to FIG. 10), for example. In an embodiment, metal bumps 66 are solder bumps, and may be referred to as ball-grid array (BGA) balls. In alternative embodiments, metal bumps 66 are not reflowable, and may be formed of copper, nickel, palladium, and the like.

Figure 9:
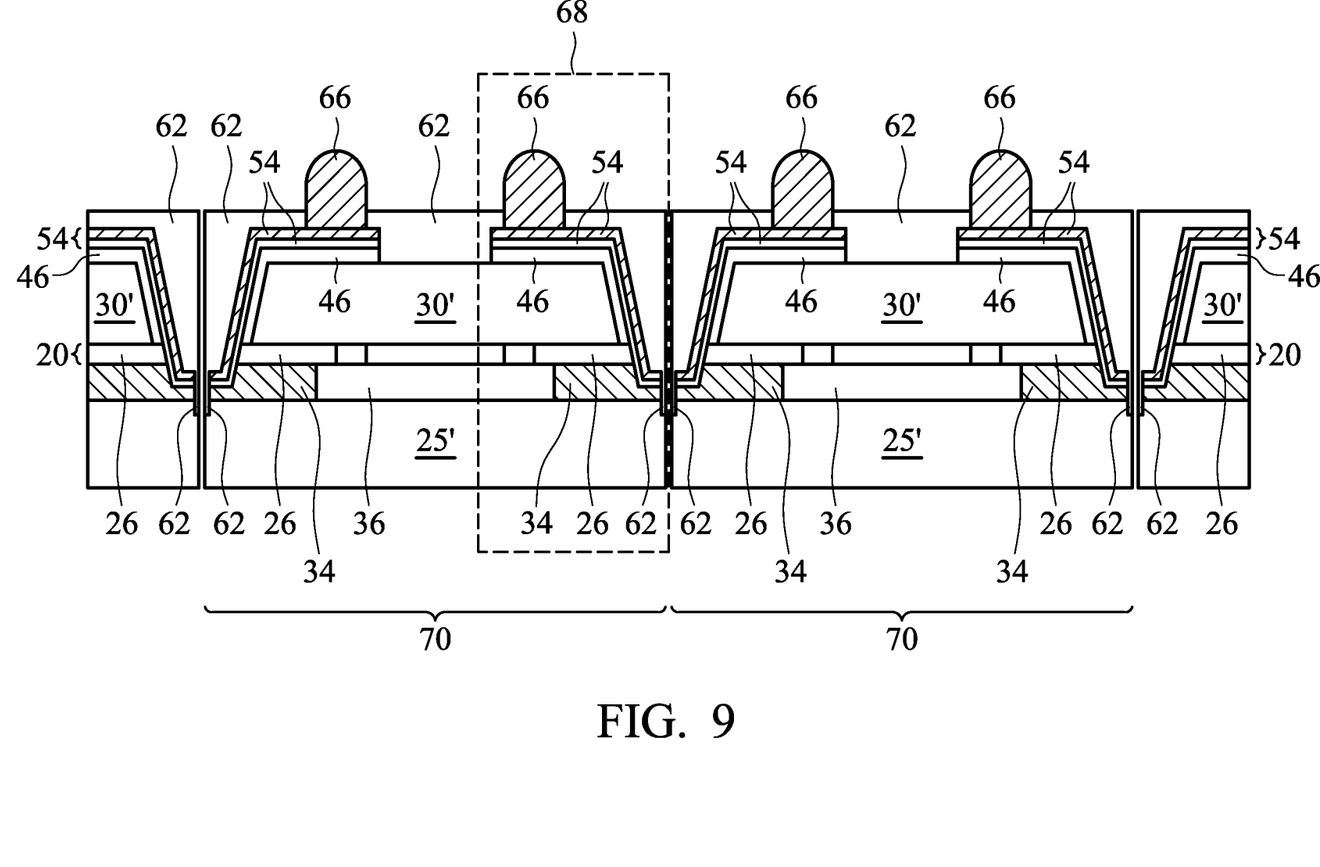
Figure 10:
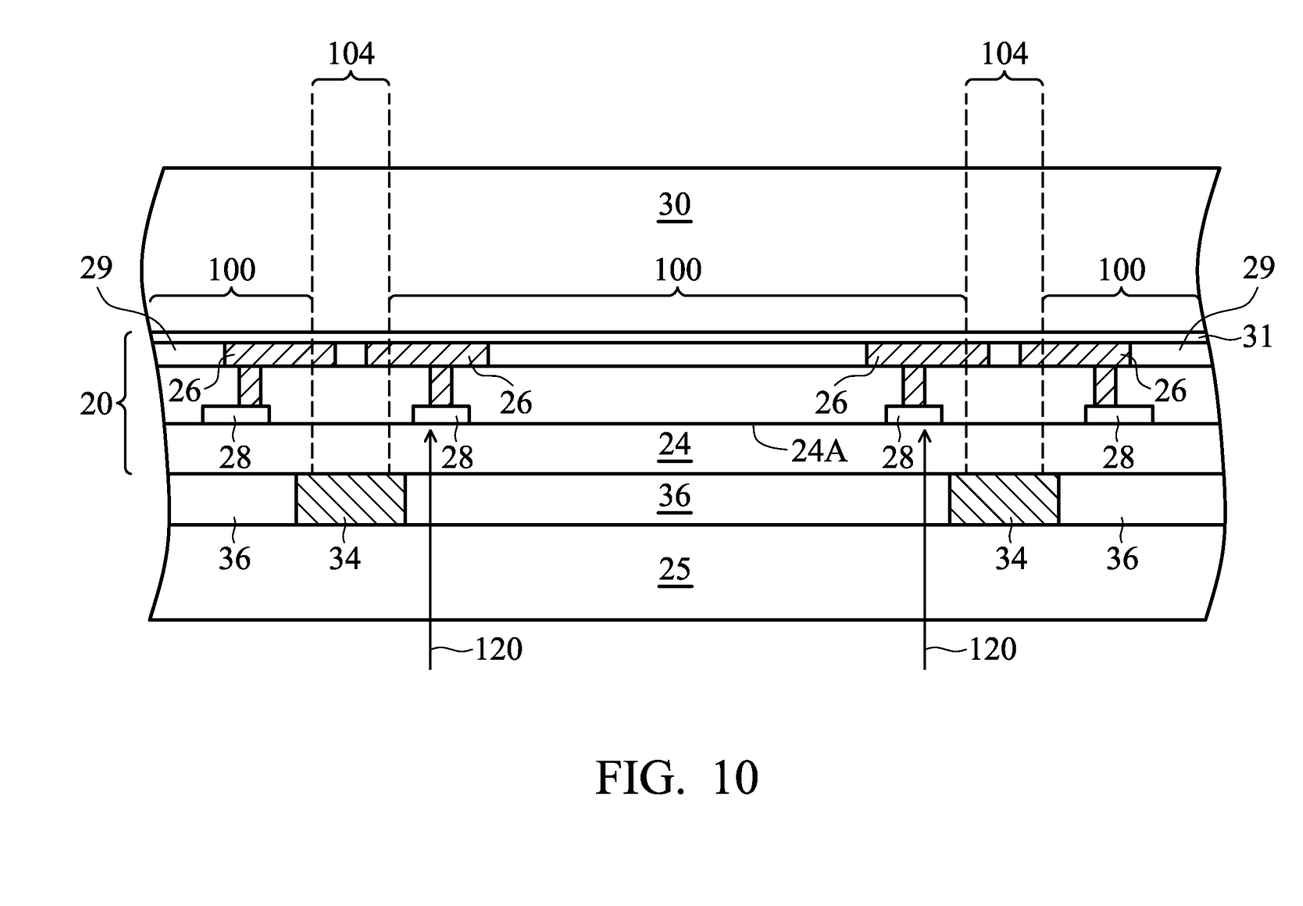
FIG. 10 illustrates the cross-sectional view of a portion of the package structure before the T-contacts are made.

Referring to FIG. 9, a die-saw is performed to saw through solder mask film 62, solder-masks 34, and transparent wafer 25. The package structure as shown in FIG. 9 is thus separated into individual dies 70. The width of this die-saw is smaller than the width of the pre-cut as shown in FIG. 6, so that portions of dielectric coating 62 (FIG. 7) filled into trenches 60 (FIG. 8) remain after the die-saw.

Figure 11:
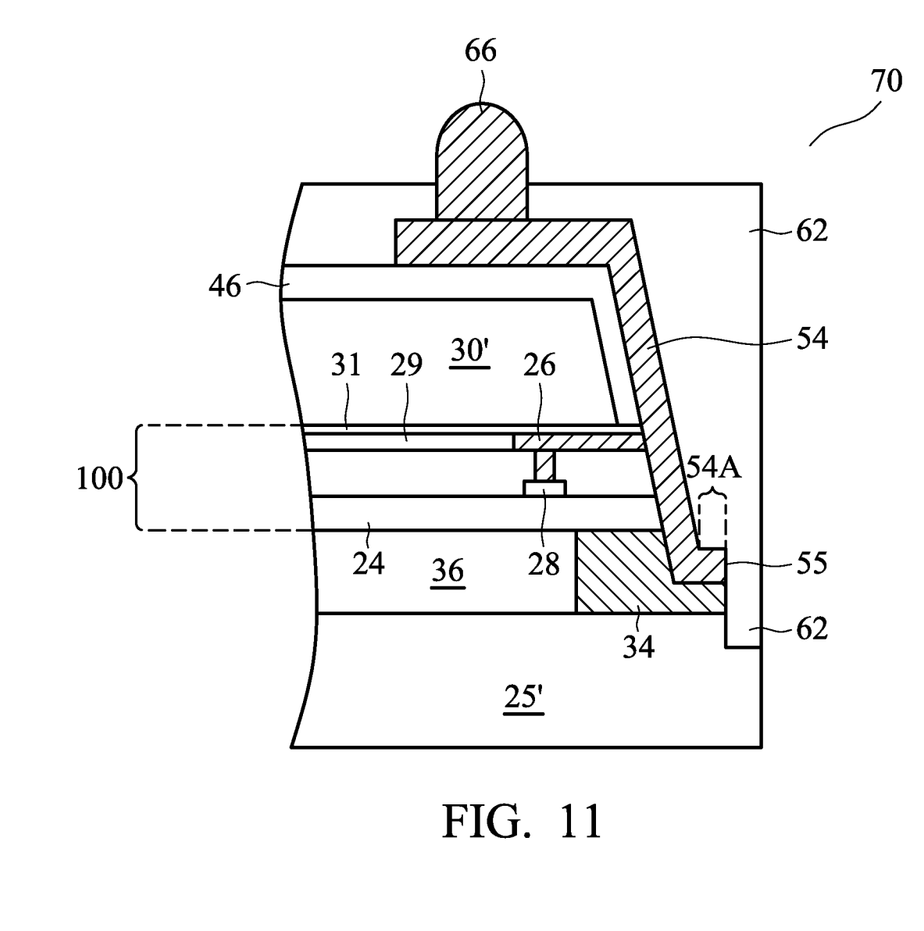
FIG. 11 illustrates the cross-sectional view of a portion of the package structure after the formation of the T-contacts.

FIG. 11 illustrates a magnified view of portion 68 in FIG. 9. It is observed that the remaining portions of solder mask film 62 covers edges 55 of metal leads 54, and no portion of metal leads 54 is exposed to open air. Accordingly, metal leads 54 are free from the corrosion caused by the moisture in the air. Each of the resulting dies 70 includes transparent die 25', which is a portion of transparent wafer 25, die 100, and carrier die 30', which is a portion of carrier wafer 30. In a top view of the structure shown in FIG. 9, dams 34 in each of the resulting dies 70 forms a square-shaped ring encircling air-gap 36. Dies 70 as shown in FIG. 9 may then be bonded to other package components, for example, a printed circuit board (PCB, not shown), with the BGA balls 66 bonded to the PCB.

By using the embodiments, metal leads 54 (FIG. 11) have no exposed portions, and hence are not subject to the corrosion. The protection of metal leads 54 do not require extra protection materials other than solder masks, and hence no extra manufacturing cost related to the extra protection materials is needed.

In accordance with embodiments, a method includes performing a first die-saw on a package structure includes forming a first and a second metal lead extending into a trench of a package structure, wherein the first and the second metal leads contact the side edges of contact pads that are in devices in the package structure. The first and the second metal leads are interconnected through a connecting metal portion. A pre-cut is performed to cut the connecting metal portion to separate the first and the second metal leads, wherein remaining portions of the connecting metal portion have edges after the pre-cut. A dielectric coating is formed over the first and the second metal leads. A die-saw is performed to saw apart the package structure, so that the first and the second dies are separated into separate piece. In each of the resulting pieces, the edges of the remaining portions of the connecting metal portion are covered by remaining portions of the first dielectric coating.

In accordance with other embodiments, a method includes providing a package structure including a device wafer comprising a plurality of device dies, and scribe lines between the device dies. A carrier wafer is over and bonded to a top side of the device wafer. A glass wafer is under the device wafer. Dams bond a bottom side of the device wafer to the glass wafer, wherein the dams overlap scribe lines, and do not overlap center regions of the plurality of device dies. A first trench is formed in the carrier wafer and the device wafer until contacts pads in the device wafer are exposed. A first dielectric coating is formed to extend into the first trench. A first die-saw is performed to saw the first dielectric coating and the scribe lines of the device wafer, wherein side edges of the contact pads are exposed after the first die-saw. Metal leads are formed over remaining portions of the first dielectric coating and contacting the side edges of the contact pads. A pre-cut is performed to cut connecting portions of metal leads, wherein each of the connecting portions interconnects two of the metal leads. A second dielectric coating is formed to cover the metal leads. A second die-saw is performed to separate the package structure into individual pieces, wherein no remaining portions of the metal leads in the individual pieces are exposed to open air.

In accordance with yet other embodiments, a device die includes integrated circuits and a contact pad. A carrier die is over and bonded to a top side of the device die. A first dielectric coating is formed on a sidewall of the carrier die. A metal lead is formed over and contacting the first dielectric coating. The metal lead contacts a side edge of the contact pad to form a T-contact, wherein the metal lead extends to directly over the carrier die and the device die. A second dielectric coating is over and contacting the metal lead. All edges of the metal lead are covered, and wherein no edge of the metal lead is exposed through the second dielectric coating.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   performing a first die-saw on a package structure comprising:
   a device wafer comprising:
   a first die, wherein the first die comprises a first contact pad; and
   a second die comprising a second contact pad; and
   a carrier wafer attached to the device wafer, wherein the first die-saw forms a first trench in the package structure, and wherein side edges of the first and the second contact pads are exposed to the first trench;
   forming a first metal lead and a second metal lead extending into the first trench and contacting the side edges of the first and the second contact pads, respectively, wherein the first and the second metal leads are interconnected through a connecting metal portion;
   performing a pre-cut to cut the connecting metal portion to separate the first and the second metal leads, wherein remaining portions of the connecting metal portion comprises edges after the pre-cut;
   forming a first dielectric coating over the first and the second metal leads; and
   performing a second die-saw to saw apart the package structure, wherein the first and the second dies are separated into a first piece and a second piece respectively, and wherein in the first and the second pieces, the edges of the remaining portions of the connecting metal portion are covered by remaining portions of the first dielectric coating.

2. The method of claim 1, wherein the package structure further comprises:
   a transparent wafer; and
   a dam joining the transparent wafer to the device wafer, wherein the first trench extends into the dam.

3. The method of claim 2, wherein in the pre-cut, a top portion of the transparent wafer is cut, and a lower portion of the transparent wafer is not cut.

4. The method of claim 1 further comprising, before the step of forming the first and the second metal leads:
   performing an etching to form a second trench in the carrier wafer and the device wafer, wherein top surfaces of the first and the second contact pads are exposed to the second trench; and
   forming a second dielectric coating extending into the second trench, wherein a portion of the second dielectric coating is removed in the first die-saw, and wherein the first and the second metal leads are formed over and contacting the second dielectric coating.

5. The method of claim 4, wherein the second dielectric coating comprises a solder mask.

6. The method of claim 1, wherein the pre-cut forms a trench having a width smaller than a width of the second die-saw.

7. The method of claim 1, wherein the first dielectric coating comprises a solder mask.

8. A method comprising:
   providing a package structure comprising:

a device wafer comprising a plurality of device dies, and scribe lines between the device dies;

a carrier wafer over and bonded to a top side of the device wafer;

a glass wafer under the device wafer; and dams bonding a bottom side of the device wafer to the glass wafer, wherein the dams overlap scribe lines, and do not overlap center regions of the plurality of device dies;

forming a first trench in the carrier wafer and the device wafer until contacts pads in the device wafer are exposed;

forming a first dielectric coating to extend into the first trench;

performing a first die-saw to saw the first dielectric coating and the scribe lines of the device wafer, wherein side edges of the contact pads are exposed after the first die-saw;

forming metal leads over remaining portions of the first dielectric coating and contacting the side edges of the contact pads;

performing a pre-cut to cut connecting portions of metal leads, wherein each of the connecting portions interconnects two of the metal leads;

forming a second dielectric coating to cover the metal leads; and performing a second die-saw to separate the package structure into individual pieces, wherein no remaining portions of the metal leads in the individual pieces are exposed to open air.

9. The method of claim 8, wherein the step of forming the metal leads comprises:

blanket forming a metal layer; and performing a patterning to the metal layer to form the metal leads.

10. The method of claim 8, wherein the second die-saw has a saw width smaller than a width of the pre-cut.

11. The method of claim 8, wherein the plurality of device dies comprises image sensors electrically coupled to the contact pads, and wherein the device dies are separated from the glass wafer by vacuum-gaps.

12. The method of claim 8, wherein a second trench formed by the first die-saw extends into the dams and not into the glass wafer.

13. The method of claim 8, wherein a third trench formed by the pre-cut extends into the glass wafer, and wherein the pre-cut does not cut through the glass wafer.

14. The method of claim 8, wherein the step of forming the first trench comprises etching.

15. A device comprising:

a device die comprising integrated circuits and a contact pad;

a carrier die over and bonded to a top side of the device die;

a first dielectric coating on a sidewall of the carrier die;

a metal lead over and contacting the first dielectric coating, wherein the metal lead extends vertically lower than a bottom surface of the contact pad and contacts a side edge of the contact pad to form a T-contact, and wherein the metal lead extends to directly over the carrier die and the device die; and a second dielectric coating over and contacting the metal lead, wherein all edges of the metal lead are covered, and wherein no edge of the metal lead is exposed through the second dielectric coating.

16. The device of claim 15, wherein the second dielectric coating is a single-layered coating, with no interface formed inside the second dielectric coating.

17. The device of claim 15, wherein the first and the second dielectric coatings are formed of solder masks.

18. The device of claim 15 further comprising:

a transparent die under the device die; and a dam bonding the device die to the transparent die, wherein the dam forms a ring overlapping edge regions of the device die, and not overlapping a center region of the device die; and an air-gap separating the center region of the device die from the transparent die.

19. The device of claim 15, wherein the metal lead comprises a horizontal portion lower than the contact pad, and wherein the second dielectric coating contacts an edge of the horizontal portion of the metal lead.

20. The device of claim 15 further comprising a metal bump directly over the device die and the carrier die, wherein the metal bump contacts the metal lead through an opening in the second dielectric coating.

* * * * *